(12) United States Patent
Sasaki

(10) Patent No.: US 11,903,327 B2
(45) Date of Patent: Feb. 13, 2024

(54) SPIN ELEMENT AND MAGNETIC MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/983,812

(22) Filed: Nov. 9, 2022

(65) Prior Publication Data

US 2023/0071849 A1    Mar. 9, 2023

Related U.S. Application Data

(62) Division of application No. 16/756,262, filed as application No. PCT/JP2019/004840 on Feb. 12, 2019, now Pat. No. 11,538,984.

(30) Foreign Application Priority Data

Feb. 19, 2018 (JP) .................................. 2018-027130
Oct. 10, 2018 (WO) .................. PCT/JP2018/037721

(51) Int. Cl.
*H10N 50/80* (2023.01)
*H01F 10/32* (2006.01)
*H10B 61/00* (2023.01)
*H10N 52/80* (2023.01)
*H10N 52/00* (2023.01)
(Continued)

(52) U.S. Cl.
CPC ........... *H10N 50/80* (2023.02); *H01F 10/329* (2013.01); *H01F 10/3254* (2013.01); *H10B 61/22* (2023.02); *H10N 52/101* (2023.02); *H10N 52/80* (2023.02); *G11C 11/161* (2013.01); *G11C 11/1659* (2013.01); *G11C 11/1673* (2013.01);
(Continued)

(58) Field of Classification Search
CPC ... H10N 50/80; H01F 10/3254; H01F 10/329; G11C 11/161
USPC .......................................................... 257/421
See application file for complete search history.

(56) References Cited

U.S. PATENT DOCUMENTS 8,350,347 B2    1/2013   Gaudin et al.
9,691,458 B2    6/2017   Ralph et al.
(Continued)

FOREIGN PATENT DOCUMENTS

CN    108011037 A    5/2018
JP    2004-220692 A    8/2004
(Continued)

OTHER PUBLICATIONS

Fukami et al.; "A spin-orbit torque switching scheme with collinear magnetic easy axis current configuration;" Nature Nanotechnology; 2016; pp. 1-6.

(Continued)

*Primary Examiner* — Jami Valentine Miller
(74) *Attorney, Agent, or Firm* — Oliff PLC

(57) ABSTRACT

This spin element includes: a current-carrying part that extends in a first direction; and an element part that is laminated on one surface of the current-carrying part, wherein the current-carrying part includes a first wiring and a second wiring in order from a side of the element part, and wherein both of the first wiring and the second wiring are metals and temperature dependence of resistivity of the first wiring is larger than temperature dependence of resistivity of the second wiring in at least a temperature range of −40° C. to 100° C.

4 Claims, 6 Drawing Sheets

(51) Int. Cl.
*G11C 11/16* (2006.01)
*H10N 50/85* (2023.01)

(52) U.S. Cl.
CPC .......... *G11C 11/1675* (2013.01); *H10B 61/00* (2023.02); *H10N 50/85* (2023.02)

(56) References Cited

U.S. PATENT DOCUMENTS

| | | |
|---|---|---|
| 2004/0136120 A1 | 7/2004 | Hayakawa et al. |
| 2009/0161265 A1 | 6/2009 | Sugano et al. |
| 2014/0056060 A1 | 2/2014 | Khvalkovskiy et al. |
| 2014/0198564 A1 | 7/2014 | Guo |
| 2015/0036415 A1 | 2/2015 | Di Pendina et al. |
| 2015/0348606 A1 | 12/2015 | Buhrman et al. |
| 2016/0169988 A1 | 6/2016 | Sirringhaus et al. |
| 2017/0076769 A1 | 3/2017 | Shirotori et al. |
| 2017/0076770 A1 | 3/2017 | Daibou et al. |
| 2017/0222135 A1* | 8/2017 | Fukami ............... G11C 11/1675 |
| 2018/0033953 A1 | 2/2018 | Sasaki et al. |
| 2018/0123021 A1 | 5/2018 | Sasaki et al. |
| 2018/0254773 A1* | 9/2018 | Yoshinari ............... H04L 9/0852 |
| 2018/0337326 A1 | 11/2018 | Sasaki |
| 2018/0350417 A1 | 12/2018 | Shiokawa et al. |
| 2018/0351082 A1 | 12/2018 | Sasaki et al. |
| 2018/0351083 A1 | 12/2018 | Sasaki |
| 2018/0351084 A1 | 12/2018 | Sasaki |
| 2018/0351085 A1 | 12/2018 | Shiokawa et al. |
| 2019/0035446 A1 | 1/2019 | Shibata et al. |
| 2019/0051815 A1 | 2/2019 | Kakinuma et al. |
| 2019/0074123 A1* | 3/2019 | Sasaki ................. H10B 61/00 |
| 2019/0147929 A1* | 5/2019 | Sasaki ................. G11C 11/16 365/158 |
| 2019/0267064 A1* | 8/2019 | Shiokawa ............... H10N 50/80 |
| 2019/0267541 A1* | 8/2019 | Shiokawa ........... G11C 11/1675 |
| 2020/0243752 A1 | 7/2020 | Sasaki |
| 2020/0395533 A1* | 12/2020 | Sasaki ................. H01F 10/329 |
| 2023/0071849 A1* | 3/2023 | Sasaki ................. H10N 50/10 |

FOREIGN PATENT DOCUMENTS

| | | |
|---|---|---|
| JP | 2008-076289 A | 4/2008 |
| JP | 2009-158554 A | 7/2009 |
| JP | 2014-045196 A | 3/2014 |
| JP | 2014-086448 A | 5/2014 |
| JP | 2017-059594 A | 3/2017 |
| JP | 2017-059634 A | 3/2017 |
| JP | 2018-026525 A | 2/2018 |
| WO | 2016/021468 A1 | 2/2016 |
| WO | 2016/159017 A1 | 10/2016 |
| WO | 2017/090726 A1 | 6/2017 |
| WO | 2017/213261 A1 | 12/2017 |

OTHER PUBLICATIONS

Kato et al.; "Observation of the Spin Hall Efffect in Semiconductors;" Science; 2004; pp. 1910-1913; vol. 306.
Miron et al.; Perpendicular switching of a single ferromagnetic layer induced by in-plane current injection; Nature; 2011; pp. 189-194; vol. 476.
Liu et al.; "Spin torque switching with the giant spin Hall effect of tantalum;" Science; 2012; pp. 1-32; vol. 336.
Liu et al.; "Current-Induced Switching of Perpendicularly Magnetized Magnetic Layers Using Spin Torque from the Spin Hall Effect;" Physical Review Letters; 2012; pp. 096602-1-096602-5; vol. 109.
Lee et al.; "Threshold current for switching of a perpendicular magnetic layer induced by spin Hall effect;" Applied Physical Letters; 2013; pp. 1-17; vol. 102.
Lee et al.; "Thermally activated switching of perpendicular magnet by spin-orbit spin torque;" Appl. Phys. Lett.; 2014; 072413-1-072413-5; vol. 104.
Fukami et al.; "Magnetization switching by spin-orbit torque in an antiferromagnet-ferromagnet bilayer system;" Nature Matertials; 2016; pp. 535-542; vol. 15.
Takahashi et al.; "Spin injection and detection ni magnetic nanostructures;" Physical Review B; 2003; pp. 052409-1-052409-4; vol. 67.
Seo et al.; "Area-Efficient SOT-MRAM With a Schottky Diode;" IEEE Electron Device Letters; 2016; pp. 982-985; vol. 37, No. 8.
Zhang et al.; "Spin Hall Effects in Metallic Antiferromagnets;" Physical Review Letters; 2014; pp. 196602-1-196602-6; vol. 113.
Apr. 16, 2019 Search Report issued in International Patent Application No. PCT/JP2019/004840.
Dec. 18, 2018 Written Opinion of the International Search Report issued in International Patent Application No. PCT/JP2018/037721.
Aug. 4, 2022 Office Action Issued in U.S. Appl. No. 16/756,262.
Mar. 29, 2022 Restriction Requirement issued in U.S. Appl. No. 16/756,262.
Nov. 4, 2020 Office Action issued in U.S. Appl. No. 16/338,653.

\* cited by examiner

SPIN ELEMENT AND MAGNETIC MEMORY

The present invention relates to a spin element and a magnetic memory. This is a Division of application Ser. No. 16/756,262 filed Apr. 15, 2020, which in turn is a National Stage Application of PCT/JP2019/004840 filed on Feb. 12, 2019, which claims priority to PCT/JP2018/037721 filed on Oct. 10, 2018, and Japanese Patent Application No. 2018-027130 filed on Feb. 19, 2018. The disclosure of the prior applications is hereby incorporated by reference herein in its entirety.

TECHNICAL FIELD

Background Art

A giant magnetoresistance (GMR) element including a multilayer film of a ferromagnetic layer and a non-magnetic layer and a tunnel magnetoresistance (TMR) element using an insulating layer (a tunnel barrier layer and a barrier layer) for a non-magnetic layer are known as a magnetoresistance effect element. Generally, the TMR element has a higher element resistance and a higher magnetoresistance (MR) ratio than those of the GMR element. For this reason, TMR elements have been gaining attention as elements for magnetic sensors, high-frequency components, magnetic heads, and magnetic random access memories (MRAMs).

In recent years, magnetization reversal using a pure spin current generated by a spin-orbit interaction has been gaining attention (for example, Non-Patent Document 1). A spin-orbit torque (SOT) is induced by a pure spin current caused by a spin-orbit interaction or a Rashba effect in an interface between different materials. A current for inducing an SOT in a magnetoresistance effect element flows in a direction intersecting a laminating direction of the magnetoresistance effect element. That is, there is no need for a current to flow in a laminating direction of the magnetoresistance effect element, and such magnetoresistance effect elements can be expected to have a longer lifespan.

PRIOR ART DOCUMENTS

Non-Patent Document

Non-Patent Document 1: S. Fukami, T. Anekawa, C. Zhang and H. Ohno, Nature Nano Tec (2016). DOI: 10.1038/NNANO.2016.29.

DISCLOSURE OF THE INVENTION

Problems to be Solved by the Invention

An element that uses a magnetoresistance effect is used for various applications and operation guarantee in a wide temperature range is required. In a spin element using an SOT, the magnitude of the magnetic anisotropy energy of the ferromagnetic material, the resistivity of the wiring, and the like change depending on the temperature. For that reason, there is a need for a spin element using an SOT that operates stably even when the operating temperature range changes. Further, such a situation is not limited to the spin-orbit-torque magnetization rotational element, but the same applies to a magnetic domain wall displacement type magnetic recording element using a movement of a magnetic domain wall.

The present invention has been made in view of the above-described circumstances and an object of the present invention is to provide a spin element and a magnetic memory with low temperature dependence.

Solutions for Solving the Problems

The present inventors have carried out a careful examination and found that temperature dependence of a spin element can be reduced by forming a current-carrying part to have a lamination structure of a first wiring and a second wiring and changing a distribution ratio of a current flowing in the first wiring and the second wiring for each temperature range.

The present invention provides the following solutions in order to solve the above-described problems.

(1) A spin element according to a first aspect includes: a current-carrying part that extends in a first direction; and an element part that faces the current-carrying part, wherein the current-carrying part includes a first wiring and a second wiring in order from a side of the element part, and wherein both of the first wiring and the second wiring are metals and temperature dependence of resistivity of the first wiring is larger than temperature dependence of resistivity of the second wiring in at least a temperature range of −40° C. to 100° C.

(2) A spin element according to a second aspect includes: a current-carrying part that extends in a first direction; and an element part that faces the current-carrying part, wherein the current-carrying part includes a first wiring and a second wiring in order from a side of the element part, and wherein the first wiring is a metal and the second wiring is a semiconductor.

(3) A spin element according to a third aspect includes: a current-carrying part that extends in a first direction; and an element part that faces the current-carrying part, wherein the current-carrying part includes a first wiring and a second wiring in order from a side of the element part, and wherein the first wiring is a metal and the second wiring is a topological insulator.

(4) A spin element according to a fourth aspect includes: a current-carrying part that extends in a first direction; and an element part that faces the current-carrying part, wherein the current-carrying part includes a first wiring and a second wiring in order from a side of the element part, and wherein the first wiring is a semiconductor and the second wiring is a topological insulator.

(5) In the spin element according to the above-described aspect, the current-carrying part may be a spin-orbit torque wiring configured to apply a spin-orbit torque to a magnetization of the first ferromagnetic layer so as to rotate the magnetization of the first ferromagnetic layer and the element part may include a first ferromagnetic layer.

(6) In the spin element according to the above-described aspect, the current-carrying part may be a spin-orbit torque wiring configured to apply a spin-orbit torque to magnetization of the first ferromagnetic layer so as to rotate the magnetization of the first ferromagnetic layer and the element part may include a first ferromagnetic layer, a non-magnetic layer, and a second ferromagnetic layer in order from a position near the current-carrying part.

(7) In the spin element according to the above-described aspect, the current-carrying part may be a magnetic recording layer including a magnetic domain wall and the element part may include a non-magnetic layer and a first ferromagnetic layer in order from a position near the magnetic recording layer.

(8) In the spin element according to the above-described aspect, the second wiring may contain one or more alloys selected from a group consisting of chromel, constantan, nichrome, platinum rhodium, manganin, and alumel.

(9) In the spin element according to the above-described aspect, the first wiring may contain at least one element selected from a group consisting of tungsten, bismuth, rubidium, tantalum, molybdenum, rhodium, and tin and the second wiring may contain at least one element selected from a group consisting of iridium, platinum, and palladium.

(10) In the spin element according to the above-described aspect, the first wiring may contain a non-magnetic metal having a large atomic number of 39 or more and having d electrons or f electrons in an outermost shell.

(11) In the spin element according to the above-described aspect, the first wiring may have a thickness equal to or smaller than a spin diffusion length of an element constituting the first wiring.

(12) A magnetic memory according to a fifth aspect includes a plurality of the spin elements according to the above-described aspect.

Effects of the Invention

According to the spin element of the above-described aspect, the temperature dependence can be reduced.

EMBODIMENTS FOR CARRYING OUT THE INVENTION

Figure 1:
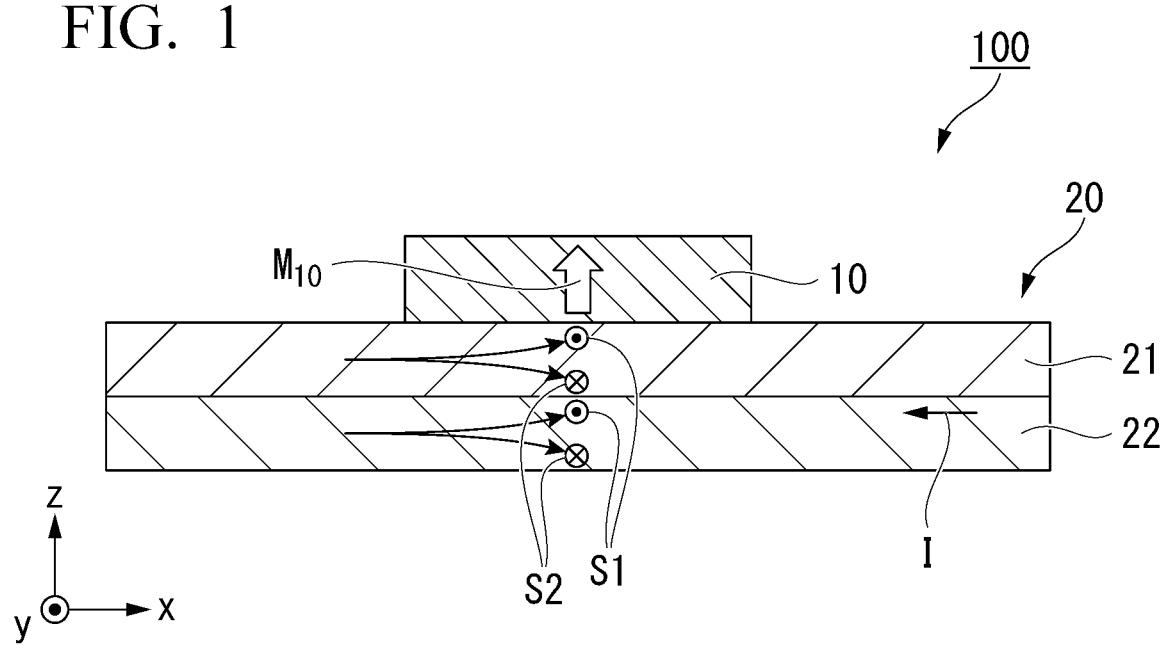
FIG. 1 is a schematic cross-sectional view of a spin-orbit-torque magnetization rotational element according to a first embodiment.

Hereinafter, preferred examples of the present invention will be described in detail by appropriately referring to the drawings. In the drawings used in the following description, characteristic parts are enlarged for convenience of description in order to easily understand the characteristics of the present invention and hence the dimensional ratio of each component may be different from the actual one. The materials, dimensions, and the like exemplified in the following description are merely examples and the present invention is not limited thereto and can be implemented with appropriate modifications within a range in which the effects of the present invention are exhibited.

First Embodiment (Spin-Orbit-Torque Magnetization Rotational Element)

FIG. 1 is a schematic cross-sectional view showing a spin-orbit-torque magnetization rotational element according to a first embodiment. The spin-orbit-torque element is an example of a spin element. A spin-orbit-torque magnetization rotational element 100 shown in FIG. 1 includes a first ferromagnetic layer 10 and a spin-orbit torque wiring 20. The spin-orbit torque wiring is an example of a current-carrying part. The first ferromagnetic layer 10 is an example of an element part. The first ferromagnetic layer 10 faces the spin-orbit torque wiring 20. "Facing" means a relationship of facing each other and two layers may be in contact with each other or another layer may be interposed therebetween.

Hereinafter, a description will be made on the assumption that a first direction in which the spin-orbit torque wiring 20 extends is defined as the x direction, a direction orthogonal to the first direction within a plane where the spin-orbit torque wiring 20 exists is defined as the y direction, and a direction orthogonal to the x direction and the y direction is defined as the z direction. In FIG. 1, the z direction matches the laminating direction of the first ferromagnetic layer 10 and the thickness direction of the spin-orbit torque wiring 20.

<First Ferromagnetic Layer>

The first ferromagnetic layer 10 functions by changing the direction of magnetization $M_{10}$. The axis of easy magnetization of the first ferromagnetic layer 10 shown in FIG. 1 is the z direction. The first ferromagnetic layer 10 is a perpendicular magnetization film in which the magnetization $M_{10}$ is oriented in the z direction. The first ferromagnetic layer 10 may be an in-plane magnetic film in which the magnetization $M_{10}$ is oriented in the in-plane direction of the xy plane.

A ferromagnetic material, in particular, a soft magnetic material can be applied to the first ferromagnetic layer 10. For the first ferromagnetic layer 10, for example, metals selected from a group consisting of Cr, Mn, Co, Fe, and Ni, alloys containing one or more of these metals, and alloys containing one or more of these metals and at least one or more elements of B, C and N can be used. Specifically, Co—Fe, Co—Fe—B, and Ni—Fe can be exemplified.

Further, a Heusler alloy such as $Co_2FeSi$ may be used for the first ferromagnetic layer 10. The Heusler alloy contains an intermetallic compound with a chemical composition of XYZ or $X_2YZ$. X represents a transition metal element of the Co, Fe, Ni, or Cu group or a noble metal element on the periodic table. Y represents a transition metal of the Mn, V, Cr or Ti group or an element type of X. Z represents a typical element of Group III to Group V. Examples of the Heusler alloys include, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. Heusler alloys have high spin polarization.

<Spin-Orbit Torque Wiring>

The spin-orbit torque wiring 20 extends in the x direction. The spin-orbit torque wiring 20 includes a first wiring 21 and a second wiring 22.

When a current flows to the spin-orbit-torque wiring 20, a spin current is generated due to a spin Hall effect. The spin Hall effect is a phenomenon in which a spin current is induced in a direction orthogonal to the direction of a current based on a spin-orbit interaction when a current flows through a wiring. A mechanism in which a spin current is generated by the spin Hall effect will be described.

As shown in FIG. 1, a current I flows in the x direction when a potential difference is applied to both ends of the spin-orbit torque wiring 20 in the x direction. When the current I flows in the spin-orbit torque wiring 20, each of a first spin S1 oriented in the y direction and a second spin S2 oriented in the −y direction is bent in a direction orthogonal to the current. A spin current is induced in a direction to eliminate the uneven distribution of the first spin and the second spin.

The normal Hall effect and the spin Hall effect are common in that the movement (moving) direction of the moving charges (electrons) is bent. However, in the normal Hall effect, when a charged particle moves in a magnetic field, the charged particle receives a Lorentz force and the movement direction is bent. On the other hand, in the spin Hall effect, electrons move only (a current flows only) in an environment where a magnetic field is absent and the direction in which the spin moves is bent by a spin-orbit interaction.

In a non-magnetic material (a material that is not a ferromagnetic material), the number of electrons of the first spin S1 is equal to the number of electrons of the second spin S2. Therefore, in the drawing, the number of electrons of the first spin S1 traveling in the z direction is equal to the number of electrons of the second spin S2 traveling in the −z direction. In this case, the flow of electrons is canceled and the amount of current becomes zero. This spin current without a current is particularly called a pure spin current.

If the electron flow of the first spin S1 is represented by $J_\uparrow$, the electron flow of the second spin S2 is represented by $J_\downarrow$, and the spin current is represented by $J_S$, this is defined as $J_S=J_\uparrow-J_\downarrow$. In FIG. 1, Js as a pure spin current flows in the z direction of the drawing. $J_S$ is an electron flow having a polarization of 100%. When the first ferromagnetic layer 10 is allowed to contact the upper surface of the spin-orbit torque wiring 20, the pure spin current diffuses and flows into the first ferromagnetic layer 10. That is, the spin is injected into the first ferromagnetic layer 10.

The spin-orbit torque wiring 20 includes at least a first wiring 21 and a second wiring 22. In the spin-orbit torque wiring 20, one or more layers of wiring other than the first wiring 21 and the second wiring 22 may be laminated.

The first wiring 21 is a wiring which is closest to the first ferromagnetic layer 10 in the spin-orbit torque wiring 20. The second wiring 22 is a wiring which is located at a position farther from the first ferromagnetic layer 10 than the first wiring 21.

Both of the first wiring 21 and the second wiring 22 according to the first embodiment consist of a metal. The "metal" is not limited to a simple metal, but may be an alloy. Further, the term "consist of a metal" means that other materials such as impurities are allowed to be contained when the first wiring 21 and the second wiring 22 show a metallic behavior with respect to a temperature change. The metallic behavior means a behavior in which a resistance value increases as the temperature increases.

In the first wiring 21, the temperature dependence of resistivity is larger than the temperature dependence of resistivity of the second wiring 22 in at least a temperature range of −40° C. to 100° C. The "temperature dependence of the resistivity" corresponds to a difference between the resistance value of the wiring at −40° C. and the resistance value of the wiring at 100° C. That is, a difference between the resistance value at −40° C. and the resistance value at 100° C. of the first wiring 21 is larger than a difference between the resistance value at −40° C. and the resistance value at 100° C. of the second wiring 22.

Figure 2A:
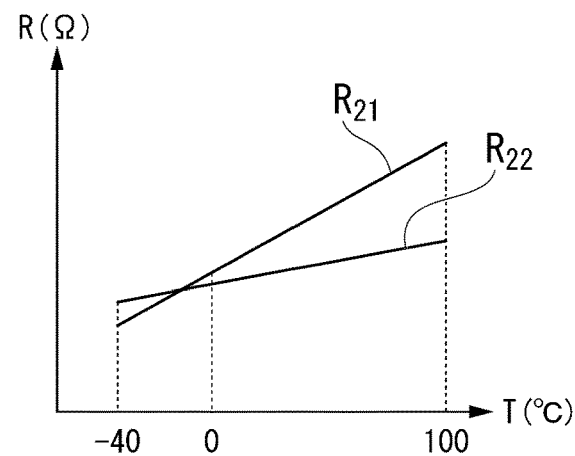
FIG. 2A is a diagram schematically showing an example of temperature dependence of resistivity of a first wiring and a second wiring of the spin-orbit-torque magnetization rotational element according to the first embodiment.
Figure 2B:
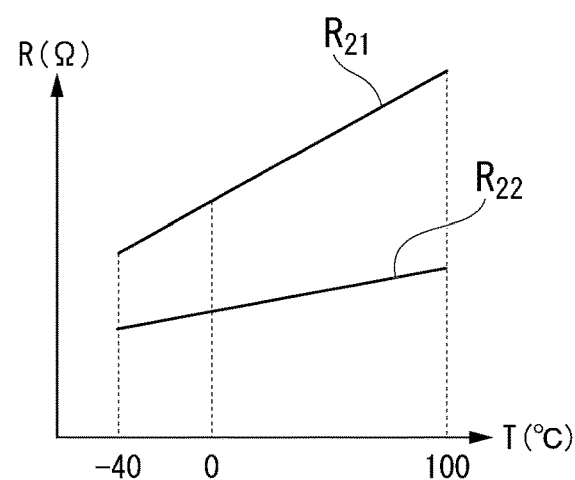
FIG. 2B is a diagram schematically showing an example of the temperature dependence of the resistivity of the first wiring and the second wiring of the spin-orbit-torque magnetization rotational element according to the first embodiment.
Figure 2C:
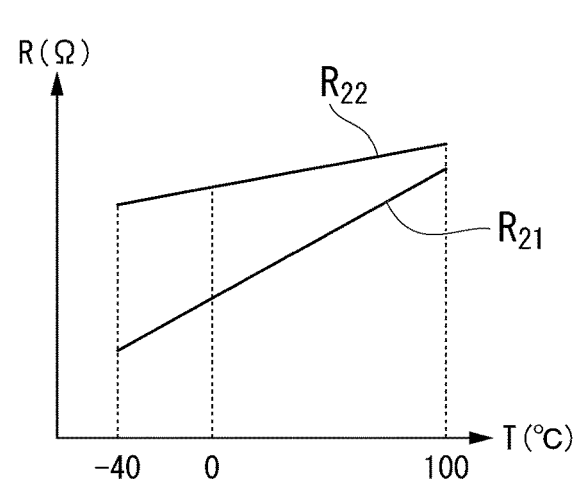
FIG. 2C is a diagram schematically showing an example of the temperature dependence of the resistivity of the first wiring and the second wiring of the spin-orbit-torque magnetization rotational element according to the first embodiment.

FIGS. 2A to 2C schematically show the temperature dependence of the resistivity of the first wiring 21 and the second wiring 22. A resistance value $R_{21}$ of the first wiring 21 and a resistance value $R_{22}$ of the second wiring 22 may have any relationship of FIGS. 2A to 2C on condition that the above-described relationship of the temperature dependence is satisfied. FIG. 2A is a diagram showing a case in which the resistance value $R_{21}$ of the first wiring 21 and the resistance value $R_{22}$ of the second wiring 22 are reversed at any temperature. FIG. 2B is a diagram showing a case in which the resistance value $R_{21}$ of the first wiring 21 is always larger than the resistance value $R_{22}$ of the second wiring 22 in a temperature range of −40° C. to 100° C. FIG. 2C is a diagram showing a case in which the resistance value $R_{21}$ of the first wiring 21 is always smaller than the resistance value $R_{22}$ of the second wiring 22 in a temperature range of −40° C. to 100° C.

The main configuration of the spin-orbit-torque wiring 5 of the first wiring 21 is preferably a non-magnetic heavy metal. The heavy metal means a metal having a specific gravity of yttrium or more. It is preferable that the non-magnetic heavy metal is a non-magnetic metal having a large atomic number of 39 or more and having d electrons or f electrons in the outermost shell. These non-magnetic metals have a large spin-orbit interaction that causes the spin Hall effect.

Electrons generally move in the direction opposite to the current regardless of their spin direction. On the other hand, a non-magnetic metal of a large atomic number having d electrons or f electrons in the outermost shell has a large spin-orbit interaction and a strong spin Hall effect. Therefore, the electron movement direction depends on the direction (orientation) of electron spin. Thus, the spin current $J_S$ is likely to occur in such a non-magnetic heavy metal.

The second wiring 22 preferably contains one or more alloys selected from a group consisting of chromel, constantan, nichrome, platinum rhodium, manganin, and alumel. These alloys have small temperature dependence and a small change in resistance value with a temperature change.

Further, as a combination of the first wiring 21 and the second wiring 22, each wiring preferably contains the following elements. The first wiring 21 preferably contains at least one element selected from a group consisting of tungsten, bismuth, rubidium, tantalum, molybdenum, rhodium, and tin. The second wiring preferably contains at least one element selected from a group consisting of iridium, platinum, and palladium.

The second wiring 22 also preferably contains a non-magnetic heavy metal in order to cause a spin Hall effect. It is preferable that both of the first wiring 21 and the second wiring 22 contain a heavy metal and have a configuration in which the above-described elements are combined. With this configuration, a large spin-orbit interaction can be generated while the first wiring 21 and the second wiring 22 satisfy the predetermined temperature dependence.

It is preferable that the thickness of the first wiring 21 is equal to or smaller than the spin diffusion length of an element constituting the first wiring 21. In the case where the thickness of the first wiring 21 is sufficiently small, the spin generated in the second wiring 22 can reach the first ferromagnetic layer 10.

For example, the thickness of the first wiring 21 is preferably 0.25 times or more and 2.0 times or less the thickness of the second wiring 22 and is more preferably 0.5 times or more and 1.0 times or less the thickness of the second wiring 22.

When the thickness of the first wiring 21 and the thickness of the second wiring 22 satisfy the above-described relationship, a difference in resistivity between the first wiring 21 and the second wiring 22 does not become large. Further, since a current flowing to the spin-orbit torque wiring 20 can be decreased, the installation area of the spin-orbit-torque magnetization rotational element or the size of the transistor can be decreased.

Further, the spin-orbit torque wiring 20 may further contain a magnetic metal. The magnetic metal represents a ferromagnetic metal or antiferromagnetic metal. When a small amount of a magnetic metal is contained in a nonmagnetic metal, this metal becomes a scattering factor of spins. When the spin is scattered, the spin-orbit interaction is enhanced and the efficiency of generating a spin current with respect to the current increases.

Meanwhile, when the added amount of the magnetic metal is too large, the generated spin current is scattered by the added magnetic metal. As a result, the effect of reducing the spin current may be increased. For that reason, it is preferable that the molar ratio of the magnetic metal to be added is sufficiently smaller than the total molar ratio of the elements constituting the spin-orbit-torque wiring. It is preferable that the molar ratio of the magnetic metal to be added is 3% or less of the whole.

The spin-orbit torque wiring 20 may further contain a topological insulator. The topological insulator is a substance in which the inside of the substance is an insulator or a high-resistance substance, but a spin-polarized metal state occurs in its surface. An internal magnetic field is generated in the topological insulator due to the spin-orbit interaction. Therefore, a new topological phase appears due to the effect of the spin-orbit interaction even in the case where an external magnetic field is absent. The topological insulator can generate a pure spin current with high efficiency due to a strong spin-orbit interaction and breaking of inversion symmetry at an edge.

Preferred examples of the topological insulator include $SnTe$, $Bi_{1.5}Sb_{0.5}Te_{1.7}Se_{1.3}$, $TlBiSe_2$, $Bi_2Te_3$, $Bi_{1-x}Sb_x$, and $(Bi_{1-x}Sbx)_2Te_3$. These topological insulators can generate a spin current with high efficiency.

(Function of Spin-Orbit-Torque Magnetization Rotational Element)

The magnetic anisotropy energy of the first ferromagnetic layer 10 at a low temperature is larger than the magnetic anisotropy energy of the first ferromagnetic layer 10 at a high temperature. That is, the magnetization $M_{10}$ of the first ferromagnetic layer 10 is difficult to rotate at a low temperature and the magnetization $M_{10}$ of the first ferromagnetic layer 10 easily rotates at a high temperature. In order to rotate the magnetization $M_{10}$ of the first ferromagnetic layer 10, it is necessary to inject more spins from the spin-orbit torque wiring 20 at a low temperature rather than a high temperature.

As shown in FIGS. 2A to 2C, the resistance values $R_{21}$ and $R_{22}$ of the first wiring 21 and the second wiring 22 at a low temperature (for example, $-40°$ C.) are smaller than the resistance values $R_{21}$ and $R_{22}$ of the first wiring 21 and the second wiring 22 at a reference temperature (for example, a room temperature). For that reason, in the case where the wiring is connected to a constant voltage source, the amount of the current flowing in the spin-orbit torque wiring 20 at a low temperature becomes larger than that at the reference temperature. When the current density of a current I flowing in the spin-orbit torque wiring 20 increases, more spins are injected into the first ferromagnetic layer 10.

Further, in the first wiring 21, the temperature dependence of the resistivity is larger than the temperature dependence of the resistivity of the second wiring 22 in at least a temperature range of $-40°$ C. to $100°$ C. It can be considered that the current I flowing in the spin-orbit torque wiring 20 branches to the first wiring 21 and the second wiring 22. The amount of the current branching to the first wiring 21 increases as the temperature decreases.

The first wiring 21 is located on the side of the first ferromagnetic layer 10 in relation to the second wiring 22. That is, the first wiring 21 is closer to the first ferromagnetic layer 10 than the second wiring 22. For that reason, when the amount of current branching to the first wiring 21 increases, more spins are efficiently injected into the first ferromagnetic layer 10.

On the contrary, the resistance values $R_{21}$ and $R_{22}$ of the first wiring 21 and the second wiring 22 at a high temperature (for example, $100°$ C.) are larger than the resistance values $R_{21}$ and $R_{22}$ of the first wiring 21 and the second wiring 22 at a reference temperature (for example, a room temperature). For that reason, in the case where the wiring is connected to a constant voltage source, the amount of the current flowing in the spin-orbit torque wiring 20 at a high temperature becomes smaller than that at the reference temperature. The amount of the current flowing in the spin-orbit torque wiring 20 decreases and the amount of spins injected into the first ferromagnetic layer 10 decreases. However, since the magnetization stability of the first ferromagnetic layer 10 decreases at a high temperature, the magnetization $M_{10}$ of the first ferromagnetic layer 10 rotates even when the amount of injected spins decreases.

Further, the resistance value $R_{22}$ of the second wiring 22 is hardly influenced by a temperature change. For that reason, the amount of current branching to the second wiring 22 at a high temperature is likely to increase compared to the first wiring 21. As the amount of current branching to the second wiring 22 increases at a high temperature, the amount of current branching to the first wiring 21 decreases relatively. Since the amount of current branching to the first wiring 21 near the first ferromagnetic layer 10 decreases, the amount of spins injected into the first ferromagnetic layer 10 decreases.

In the spin-orbit torque wiring 20, a ratio between the amount of current branching to the first wiring 21 and the amount of current branching to the second wiring 22 automatically changes in response to a temperature. Even in the case where a constant voltage is applied to the spin-orbit torque wiring 20, the amount of spins injected into the first ferromagnetic layer 10 changes in response to the stability of the magnetization $M_{10}$ of the first ferromagnetic layer 10.

As described above, the stability of the magnetization $M_{10}$ of the first ferromagnetic layer 10 is different. That is, the stability of the magnetization $M_{10}$ of the first ferromagnetic layer 10 is low at a high temperature and is high at a low temperature. Thus, in the spin-orbit-torque magnetization rotational element 100 according to the embodiment, the amount of spins injected into the first ferromagnetic layer 10 changes in response to a temperature. The amount of spins injected at a low temperature increases and the amount of spins injected at a high temperature decreases. Even in the case where the spin-orbit torque wiring 20 is connected to a voltage source applying a constant voltage, the operation is automatically compensated (guaranteed) in accordance with the stability of the magnetization $M_{10}$ of the first ferromagnetic layer 10. That is, the spin-orbit-torque magnetization rotational element 100 according to the embodiment can be used in a wide temperature range.

The spin-orbit-torque magnetization rotational element 100 according to the embodiment does not require a thermometer for measuring an operating temperature, a control unit for controlling an applied voltage, and the like. That is, the spin-orbit-torque magnetization rotational element 100 according to the embodiment can be decreased in size.

Second Embodiment

Figure 3:
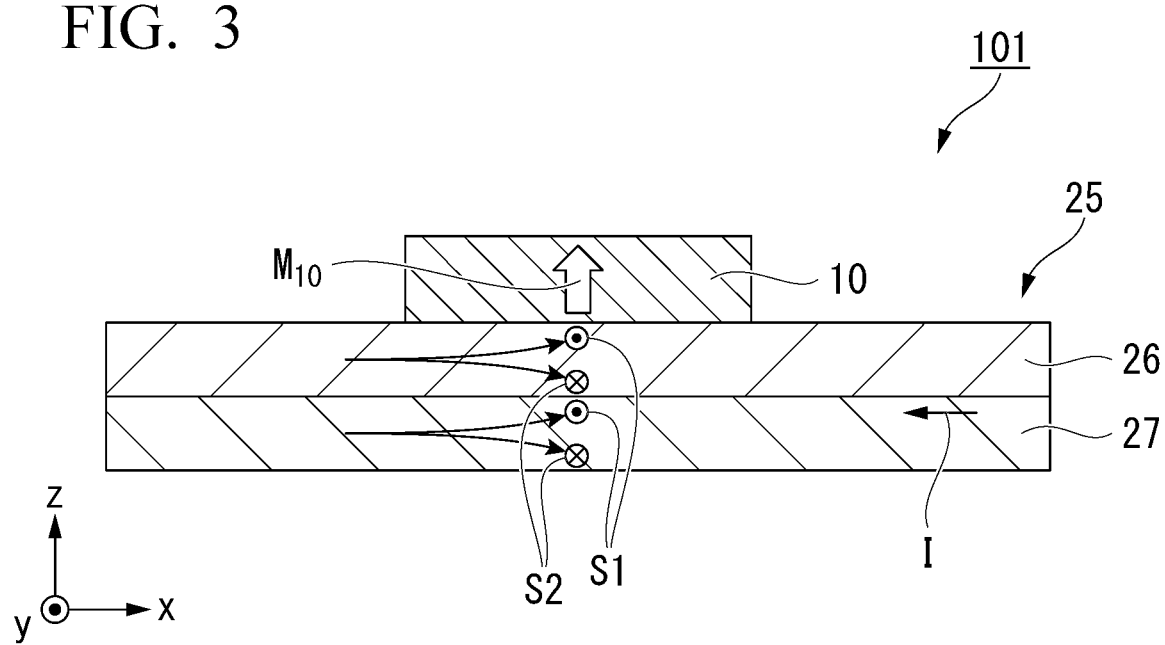
FIG. 3 is a schematic cross-sectional view of a spin-orbit-torque magnetization rotational element according to a second embodiment.

FIG. 3 is a schematic cross-sectional view of a spin-orbit-torque magnetization rotational element 101 according to a second embodiment. The spin-orbit-torque magnetization rotational element 101 shown in FIG. 3 includes a first ferromagnetic layer 10 and a spin-orbit torque wiring 25. The spin-orbit torque wiring 25 includes a first wiring 26 and a second wiring 27. The spin-orbit-torque magnetization rotational element 101 shown in FIG. 3 is different from the spin-orbit-torque magnetization rotational element 100 shown in FIG. 1 in that a material forming the second wiring 27 is a semiconductor. A description of the same configuration as that of the spin-orbit-torque magnetization rotational element 100 shown in FIG. 1 will be omitted.

The first wiring 26 is a metal and the second wiring 27 is a semiconductor. The "metal" means one having a metallic behavior with respect to a temperature. Further, the "semiconductor" means one having a semiconductor behavior with respect to a temperature. The semiconductor behavior means a behavior that a resistance value decreases as a temperature increases. Since the first wiring 26 and the second wiring 27 have a different behavior of a resistance value with respect to a temperature change, the temperature dependence of the resistance value does not matter.

Figure 4A:
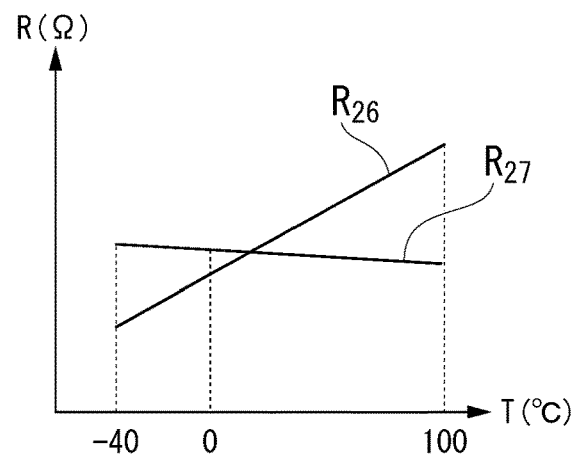
FIG. 4A is a diagram schematically showing an example of temperature dependence of resistivity of a first wiring and a second wiring of the spin-orbit-torque magnetization rotational element of the second embodiment.
Figure 4B:
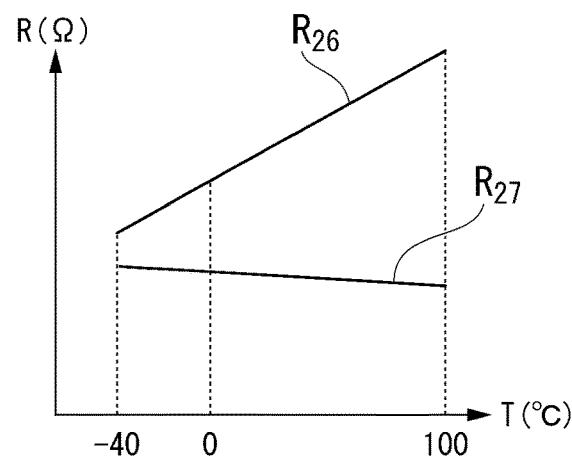
FIG. 4B is a diagram schematically showing an example of the temperature dependence of the resistivity of the first wiring and the second wiring of the spin-orbit-torque magnetization rotational element according to the second embodiment.
Figure 4C:
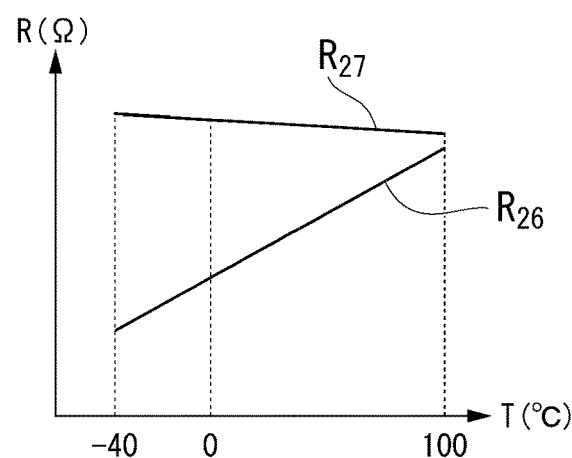
FIG. 4C is a diagram schematically showing an example of the temperature dependence of the resistivity of the first wiring and the second wiring of the spin-orbit-torque magnetization rotational element according to the second embodiment.

FIGS. 4A to 4C schematically show the temperature dependence of the resistivity of the first wiring 26 and the second wiring 27. A resistance value $R_{26}$ of the first wiring 26 and a resistance value $R_{27}$ of the second wiring 27 may have any relationship of FIGS. 4A to 4C. FIG. 4A is a diagram showing a case in which the resistance value $R_{26}$ of the first wiring 26 and the resistance value $R_{27}$ of the second wiring 27 are reversed at any temperature. FIG. 4B is a diagram showing a case in which the resistance value $R_{26}$ of the first wiring 26 is larger than the resistance value $R_{27}$ of the second wiring 27 in a temperature range of −40° C. to 100° C. FIG. 4C is a diagram showing a case in which the resistance value $R_{26}$ of the first wiring 26 is smaller than the resistance value $R_{27}$ of the second wiring 27 in a temperature range of −40° C. to 100° C. Since the second wiring 27 which is a semiconductor generally has a higher resistance value than a resistance value of the first wiring 26 which is a metal, the relationship shown in FIG. 4C is obtained in many cases.

As shown in FIGS. 4A to 4C, the resistance value of the first wiring 26 increases from a low temperature (for example, −40° C.) to a high temperature (for example, 100° C.). Meanwhile, the resistance value of the second wiring 27 decreases from a low temperature (for example, −40° C.) to a high temperature (for example, 100° C.). For that reason, the amount of current branching to the first wiring 26 increases as the temperature becomes lower and the amount of current branching to the second wiring 27 increases as the temperature becomes higher.

In the spin-orbit torque wiring 25, a ratio between the amount of current branching to the first wiring 26 and the amount of current branching to the second wiring 27 automatically changes in response to a temperature. Even in the case where a constant voltage is applied to the spin-orbit torque wiring 25, the amount of spins injected into the first ferromagnetic layer 10 changes in response to the stability of the magnetization $M_{10}$ of the first ferromagnetic layer 10.

As described above, in the spin-orbit-torque magnetization rotational element 101 according to the embodiment, the amount of spins injected into the first ferromagnetic layer 10 changes in response to a temperature. The amount of spins injected at a low temperature at which the stability of the magnetization $M_{10}$ of the first ferromagnetic layer 10 is high increases. In contrast, the amount of spins injected at a high temperature at which the stability of the magnetization $M_{10}$ of the first ferromagnetic layer 10 is low decreases. Even in the case where the spin-orbit torque wiring 25 is connected to a voltage source configured to apply a constant voltage, the operation is automatically compensated (guaranteed) in accordance with the stability of the magnetization $M_{10}$ of the first ferromagnetic layer 10. That is, the spin-orbit-torque magnetization rotational element 101 according to the embodiment can be suitably used in a wide temperature range.

The spin-orbit-torque magnetization rotational element 101 according to the embodiment does not require a thermometer for measuring an operating temperature, a control unit for controlling an applied voltage, and the like. That is, the spin-orbit-torque magnetization rotational element 101 according to the embodiment can be decreased in size.

The spin current magnetization rotational elements according to the first embodiment and the second embodiment can be applied to a magnetoresistance effect element as will be described later. However, the application is not limited to the magnetoresistance effect element, but can be applied to other applications. As other applications, for example, the spin current magnetization rotational element can be disposed in each pixel and used in a spatial light modulator that spatially modulates incident light using a magneto-optical effect. In the magnetic sensor, the magnetic field applied to the axis of easy magnetization of the magnet may be replaced with an SOT in order to avoid the effect of hysteresis due to the coercivity of the magnet.

The spin current magnetization rotational element can be particularly referred to as a spin current magnetization reversing element when the magnetization is reversed.

Modified Example

Additionally, the spin-orbit-torque magnetization rotational element according to the embodiment is not limited to the above-described one.

The first wirings 21 and 26 may be a metal and the second wirings 22 and 27 may be a topological insulator.

The first wirings 21 and 26 may be a semiconductor and the second wirings 22 and 27 may be a topological insulator.

Third Embodiment

<Spin-Orbit-Torque Type Magnetoresistance Effect Element>

Figure 5:
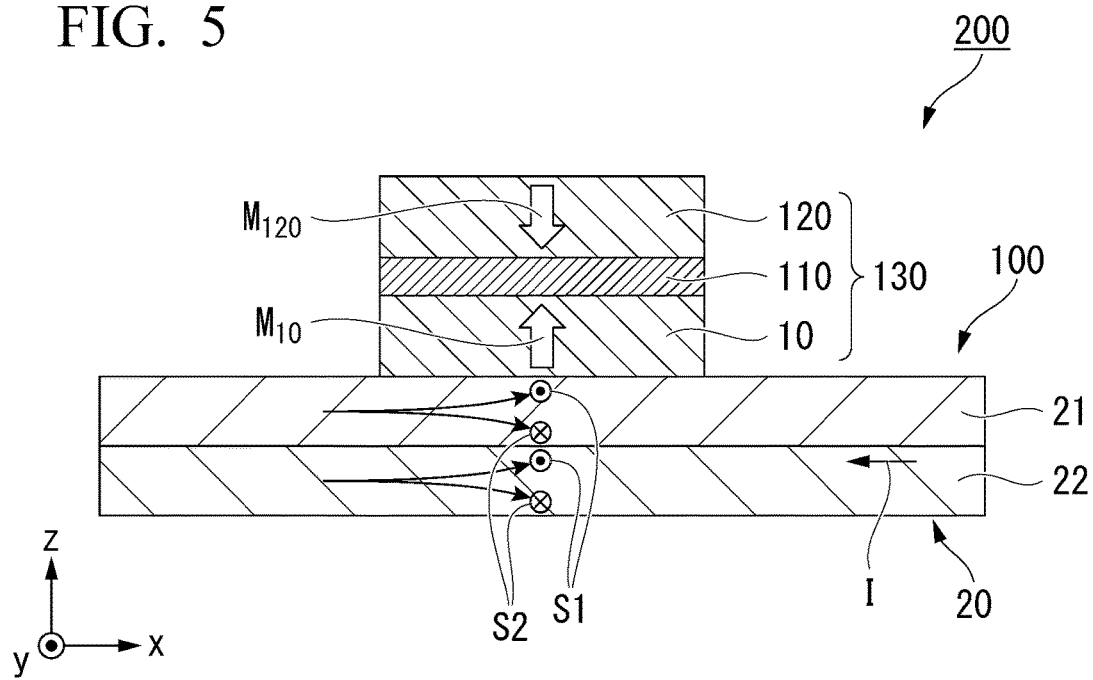
FIG. 5 is a schematic cross-sectional view of a spin-orbit-torque type magnetoresistance effect element according to a third embodiment.

FIG. 5 is a schematic cross-sectional view of a spin-orbit-torque type magnetoresistance effect element 200 according to a third embodiment. The spin-orbit-torque type magnetoresistance effect element is an example of a spin element. The spin-orbit-torque type magnetoresistance effect element 200 shown in FIG. 5 includes the spin-orbit-torque magnetization rotational element 100, a non-magnetic layer 110, and a second ferromagnetic layer 120. In FIG. 5, the spin-orbit-torque magnetization rotational element 100 according to the first embodiment is used as the spin-orbit-torque magnetization rotational element, but the spin-orbit-torque magnetization rotational element 101 according to the second embodiment may be used. A description of the same configuration as that of the spin-orbit-torque magnetization rotational element 100 of the first embodiment will be omitted.

A laminated body (a functional unit 130) obtained by laminating the first ferromagnetic layer 10, the non-magnetic layer 110, and the second ferromagnetic layer 120 functions similarly to the normal magnetoresistance effect element. The functional unit 130 is an example of an element part. The functional unit 130 functions by fixing the magnetization $M_{120}$ of the second ferromagnetic layer 120 in one direction (for example, the −z direction) and relatively changing the direction of the magnetization $M_{10}$ of the first ferromagnetic layer 10. In the case of applying to a coercivity-differed type (pseudo spin valve type) MRAM, the coercivity of the second ferromagnetic layer 120 is made larger than the coercivity of the first ferromagnetic layer 10. In the case of applying to an exchange bias type (spin valve type) MRAM, the magnetization $M_{120}$ of the second ferromagnetic layer 120 is fixed by exchange coupling with the antiferromagnetic layer.

Further, in the functional unit 130, the functional unit 130 has the same configuration as the tunneling magnetoresistance (TMR) element in the case where the non-magnetic layer 110 consists of an insulator, and the functional unit has the same configuration as the giant magnetoresistance (GMR) element in the case where the non-magnetic layer 110 consists of a metal.

The lamination configuration of the functional unit 130 can adopt the lamination configuration of the known magnetoresistance effect element. For example, each layer may include a plurality of layers or may further include other layers such as an antiferromagnetic layer for fixing the magnetization direction of the second ferromagnetic layer 120. The second ferromagnetic layer 120 is referred to as a fixed layer or a reference layer and the first ferromagnetic layer 10 is referred to as a free layer or a storage layer.

A known material can be used for the material of the second ferromagnetic layer 120. For example, a metal selected from a group consisting of Cr, Mn, Co, Fe, and Ni and an alloy containing at least one of these metals and exhibiting ferromagnetism can be used. An alloy containing one or more of these metals and at least one or more elements of B, C, and N can also be used. Specifically, Co—Fe and Co—Fe—B are exemplified. Further, a Heusler alloy such as $Co_2FeSi$ may be used for the second ferromagnetic layer 120.

In order to increase the coercivity of the second ferromagnetic layer 120 with respect to the first ferromagnetic layer 10, an antiferromagnetic material such as IrMn or PtMn may be used as a material in contact with the second ferromagnetic layer 120. Further, in order to prevent the leakage magnetic field of the second ferromagnetic layer 120 from affecting the first ferromagnetic layer 10, a synthetic ferromagnetic coupling structure may be employed.

A known material can be used for the non-magnetic layer 110.

For example, in the case where the non-magnetic layer 110 consists of an insulator (in the case of a tunnel barrier layer), $Al_2O_3$, $SiO_2$, MgO, $MgAl_2O_4$, or the like can be used as the material thereof. In addition to these, a material in which a part of Al, Si, and Mg is replaced with Zn, Be, or the like can also be used. Among these, MgO and $MgAl_2O_4$ are materials capable of realizing a coherent tunneling. In the case where the non-magnetic layer 110 consists of a metal, Cu, Au, Ag, or the like can be used as the material thereof. Further, in the case where the non-magnetic layer 110 consists of a semiconductor, Si, Ge, $CuInSe_2$, $CuGaSe_2$, $Cu(In, Ga)Se_2$, or the like can be used as the material thereof.

The functional unit 130 may include other layers. For example, the functional unit may include a cap layer on a surface opposite to the non-magnetic layer 110 in the second ferromagnetic layer 120.

The spin-orbit-torque type magnetoresistance effect element 200 according to the third embodiment can record or read data by using a change in the resistance value of the functional unit 130 caused by a difference in relative angle between the magnetization $M_{10}$ of the first ferromagnetic layer 10 and the magnetization $M_{120}$ of the second ferromagnetic layer 120. Further, since the spin-orbit-torque type magnetoresistance effect element 200 according to the third embodiment includes the spin-orbit-torque magnetization rotational element 100, the spin-orbit-torque type magnetoresistance effect element can be suitably used in a wide temperature range. Further, since the spin-orbit-torque type magnetoresistance effect element 200 according to the third embodiment includes the spin-orbit-torque magnetization rotational element 100, the element can be decreased in size.

Fourth Embodiment (Magnetic Domain Wall Displacement Type Magnetic Recording Element)

Figure 6:
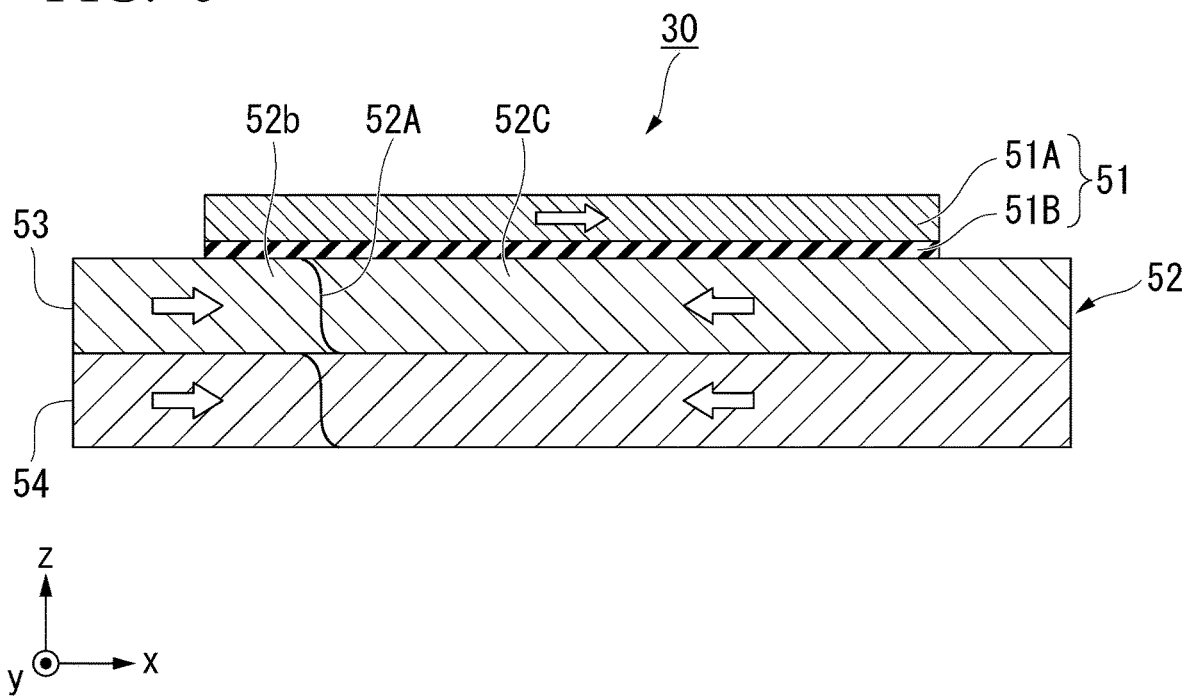
FIG. 6 is a schematic cross-sectional view of a magnetic domain wall displacement type magnetic recording element according to a fourth embodiment.

FIG. 6 is a schematic cross-sectional view of a magnetic domain wall displacement type magnetic recording element 30 which is an example of a spin element according to the embodiment. The magnetic domain wall displacement type magnetic recording element 30 shown in FIG. 6 includes an element part 51 and a magnetic recording layer 52. The magnetic recording layer 52 is an example of a current-carrying part. The element part 51 faces the magnetic recording layer (the current-carrying part) 52.

<Element Part>

The element part 51 faces the current-carrying part. That is, the element part is located on one surface of the magnetic recording layer 52. The element part 51 includes a first ferromagnetic layer 51A and a non-magnetic layer 51B. For the first ferromagnetic layer 51A and the non-magnetic layer 51B, the same layers as the second ferromagnetic layer 120 and the non-ferromagnetic layer 110 of the spin-orbit-torque type magnetoresistance effect element 200 shown in FIG. 5 can be used.

<Magnetic Recording Layer>

The magnetic recording layer 52 extends in the x direction. The magnetic recording layer 52 includes a magnetic domain wall 52A therein. The magnetic domain wall 52A is a boundary between a first magnetic domain 52B and a second magnetic domain 52C having magnetizations in opposite directions. In the magnetic domain wall displacement type magnetic recording element 30 shown in FIG. 6, the first magnetic domain 52B has magnetization oriented in the +x direction and the second magnetic domain 52C has magnetization oriented in the −x direction.

The magnetic domain wall displacement type magnetic recording element 30 records data in multi-values according to the position of the magnetic domain wall 52A of the magnetic recording layer 52. The data recorded in the magnetic recording layer 52 is read as a change in the resistance value of the laminating direction of the first ferromagnetic layer 51A and the magnetic recording layer 52. When the magnetic domain wall 52A moves, the ratio between the first magnetic domain 52B and the second magnetic domain 52C of the magnetic recording layer 52 changes. The direction of the magnetization of the first ferromagnetic layer 51A is the same as (parallel to) the direction of the magnetization of the first magnetic domain 52B and is opposite to (anti-parallel to) the direction of the magnetization of the second magnetic domain 52C. When the magnetic domain wall 52A moves in the x direction so that the area of the first magnetic domain 52B in a portion overlapping the first ferromagnetic layer 51A when viewed from the z direction becomes large, the resistance value of the magnetic domain wall displacement type magnetic recording element 30 decreases. In contrast, when the magnetic domain wall 52A moves in the −x direction so that the area of the second magnetic domain 52C in a portion overlapping the first ferromagnetic layer 51A when viewed from the z direction becomes large, the resistance value of the magnetic domain wall displacement type magnetic recording element 30 increases. The resistance value of the magnetic domain wall displacement type magnetic recording element 30 is measured between an upper electrode electrically connected to the first ferromagnetic layer 51A and an electrode provided in one end of the magnetic recording layer 52.

The magnetic domain wall 52A moves by flowing current in the extension direction of the magnetic recording layer 52 or applying an external magnetic field. For example, when a current pulse is applied in the x direction of the magnetic recording layer 52, the first magnetic domain 52B spreads in the direction toward the second magnetic domain 52C and the magnetic domain wall 52A moves in the direction toward the second magnetic domain 52C. That is, when the magnitude or the direction (the +x direction or the −x direction) of the current flowing in the magnetic recording layer 52 is set, the position of the magnetic domain wall 52A is controlled and data is written to the magnetic domain wall displacement type magnetic recording element 30.

The magnetic recording layer 52 includes a first wiring 53 and a second wiring 54. The first wiring 53 is located at a position closer to the element part 51 than the second wiring 54.

Each of the first wiring 53 and the second wiring 54 is a metal (magnetic material) having magnetism. "Metal" is not limited to a single metal, but may be an alloy. Further, the term "consist of a metal" means that other materials such as impurities are allowed to be contained when the first wiring 53 and the second wiring 54 show a metallic behavior with respect to a temperature change. The metallic behavior means a behavior in which a resistance value increases as the temperature increases.

In the first wiring 53, the temperature dependence of resistivity is larger than the temperature dependence of resistivity of the second wiring 54 in at least a temperature range of −40° C. to 100° C. The "temperature dependence of the resistivity" corresponds to a difference between the resistance value of the wiring at −40° C. and the resistance value of the wiring at 100° C. That is, the temperature dependence corresponds to a difference between the wiring resistance value of the first wiring 53 at −40° C. and the wiring resistance value thereof at 100° C. That is, a difference between the resistance value at −40° C. and the resistance value at 100° C. of the first wiring 53 is larger than a difference between the resistance value at −40° C. and the resistance value at 100° C. of the second wiring 54.

The first wiring 53 and the second wiring 54 preferably contain at least one element selected from a group consisting of Co, Ni, Pt, Pd, Gd, Tb, Mn, Ge, and Ga. For example, a laminated film of Co and Ni, a laminated film of Co and Pt, a laminated film of Co and Pd, a MnGa-based material, a GdCo-based material, and a TbCo-based material can be exemplified. The materials of the first wiring 53 and the second wiring 54 are selected so as to satisfy the above-described "temperature dependence of resistivity". In addition, ferrimagnetic materials such as a MnGa-based material, a GdCo-based material, and a TbCo-based material have low saturation magnetization and can reduce a threshold current required for moving a magnetic domain wall. Further, a laminated film of Co and Ni, a laminated film of Co and Pt, and a laminated film of Co and Pd have a large coercive force and can suppress the moving speed of the magnetic domain wall.

So far, a concrete example of a predetermined spin element has been described. The spin-orbit-torque type magnetoresistance effect elements 100 and 101 and the magnetic domain wall displacement type magnetic recording element 30 are common in that a write current flows through the current-carrying parts 20, 25, and 52 extending in a direction intersecting the element part (the first ferromagnetic layer 10, the functional unit 130, and the element part 51) during data writing. The spin element is not limited to the spin-orbit-torque type magnetoresistance effect elements 100 and 101 and the magnetic domain wall displacement type magnetic recording element 30 as long as a write current flows to the current-carrying part extending in a direction intersecting the element part during data writing.

Fifth Embodiment

<Magnetic Memory>

Figure 7:
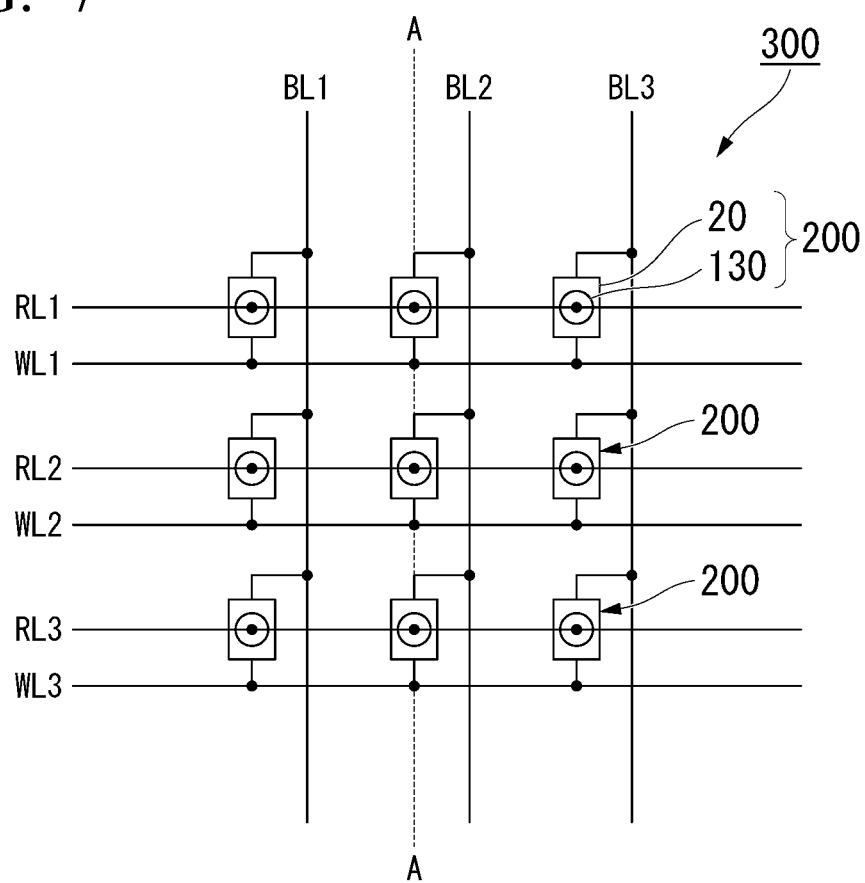
FIG. 7 is a diagram schematically showing a magnetic memory according to a fifth embodiment.

FIG. 7 is a plan view of a magnetic memory 300 including the plurality of spin-orbit-torque type magnetoresistance effect elements 200 (see FIG. 5). FIG. 5 corresponds to a cross-sectional view in which the spin-orbit-torque type magnetoresistance effect element 200 is cut along a plane A-A of FIG. 7. In the magnetic memory 300 shown in FIG. 7, the spin-orbit-torque type magnetoresistance effect elements 200 are arranged in a 3×3 matrix.

FIG. 7 shows an example of the magnetic memory and the number and arrangement of the spin-orbit-torque type magnetoresistance effect elements 200 are optional. Further, the magnetic memory may use the spin-orbit-torque magnetization rotational element 100 or the magnetic domain wall displacement type magnetic recording element 30 instead of the spin-orbit-torque type magnetoresistance effect element 200.

One of word lines WL1 to WL3, one of bit lines BL1 to BL3, and one of read lines RL1 to RL3 are respectively connected to the spin-orbit-torque type magnetoresistance effect element 200.

By selecting the word lines WL1 to WL3 and the bit lines BL1 to BL3 to which a current is applied, a current flows through the spin-orbit torque wiring 20 of an arbitrary spin-orbit-torque type magnetoresistance effect element 200 so as to perform a writing operation. By selecting the read lines RL1 to RL3 and the bit lines BL1 to BL3 to which a current is applied, a current flows in the laminating direction of an arbitrary spin-orbit-torque type magnetoresistance effect element 200 so as to perform a reading operation. The word lines WL1 to WL3, the bit lines BL1 to BL3, and the read lines RL1 to RL3 to which a current is applied can be selected by a transistor or the like. That is, this element can be used as the magnetic memory by reading data of an arbitrary element from the plurality of spin-orbit-torque type magnetoresistance effect elements 200.

As described above, the preferred embodiments of the present invention have been described in detail. However, the present invention is not limited to the particular embodiment and various modifications and changes can be made within the scope of the present invention described in the appended claims.

EXPLANATION OF REFERENCE SIGNS

10 First ferromagnetic layer
20, 25 Spin-orbit torque wiring (current-carrying part)
21, 26 First wiring
22, 27 Second wiring
30 Domain wall displacement type magnetic recording element
40 Current-carrying part
51 Element part
51A First ferromagnetic layer
51B Second ferromagnetic layer
52A Magnetic domain wall
52B First magnetic domain
52C Second magnetic domain
100, 101 Spin-orbit-torque magnetization rotational element
110 Non-magnetic layer
120 Second ferromagnetic layer
130 Functional unit
200 Spin-orbit-torque type magnetoresistance effect element
300 Magnetic memory
$M_{10}$, $M_{120}$ Magnetization

The invention claimed is:

1. A spin element comprising:
a current-carrying part that extends in a first direction; and
an element part that faces the current-carrying part,
wherein the current-carrying part includes a first wiring and a second wiring in order from a side of the element part, and
wherein the first wiring is a metal and the second wiring is a topological insulator.

2. The spin element according to claim 1,
wherein the current-carrying part is a spin-orbit torque wiring configured to apply a spin-orbit torque to magnetization of the first ferromagnetic layer so as to rotate the magnetization of the first ferromagnetic layer, and
wherein the element part includes a first ferromagnetic layer.

3. The spin element according to claim 1,
wherein the current-carrying part is a spin-orbit torque wiring configured to apply a spin-orbit torque to magnetization of the first ferromagnetic layer so as to rotate the magnetization of the first ferromagnetic layer, and
wherein the element part includes a first ferromagnetic layer, a non-magnetic layer, and a second ferromagnetic layer in order from a position near the current-carrying part.

4. The spin element according to claim 1,
wherein the current-carrying part is a magnetic recording layer including a magnetic domain wall, and
wherein the element part includes a non-magnetic layer and a first ferromagnetic layer in order from a position near the magnetic recording layer.

* * * * *